United States Patent
Van Ballegoij et al.

(10) Patent No.: US 7,030,967 B2
(45) Date of Patent: Apr. 18, 2006

(54) LITHOGRAPHIC APPARATUS, DEVICE MANUFACTURING METHOD AND SUBSTRATE HOLDER

(75) Inventors: Robertus Nicodemus Jacobus Van Ballegoij, Eindhoven (NL); Martinus Agnes Willem Cuijpers, Veldhoven (NL); Pieter Johannes Gertrudis Meijers, Horst (NL); Gerardus Petrus Matthijs Van Nunen, Berghem (NL); Joost Jeroen Ottens, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 36 days.

(21) Appl. No.: 10/738,987

(22) Filed: Dec. 19, 2003

(65) Prior Publication Data
US 2004/0179183 A1    Sep. 16, 2004

(30) Foreign Application Priority Data
Dec. 20, 2002    (EP) .................................. 02258833

(51) Int. Cl.
G03B 27/58    (2006.01)
G03B 27/42    (2006.01)

(52) U.S. Cl. .......................................... 355/72; 355/53
(58) Field of Classification Search .................. 355/53, 355/72–76; 269/21
See application file for complete search history.

(56) References Cited

U.S. PATENT DOCUMENTS

| | | | |
|---|---|---|---|
| 5,923,408 A * | 7/1999 | Takabayashi ................. 355/53 |
| 6,232,615 B1 * | 5/2001 | Van Empel ................... 250/548 |
| 6,257,564 B1 * | 7/2001 | Avneri et al. .................. 269/21 |
| 6,307,620 B1 | 10/2001 | Takabayashi et al. | |
| 6,762,826 B1 * | 7/2004 | Tsukamoto et al. ........... 355/72 |
| 6,799,940 B1 * | 10/2004 | Joe et al. ..................... 414/935 |
| 2001/0001953 A1 * | 5/2001 | Griffiths et al. .............. 118/728 |

FOREIGN PATENT DOCUMENTS

| | | |
|---|---|---|
| EP | 0 803 904 A2 | 10/1997 |
| EP | 0 803 904 A3 | 10/1997 |
| EP | 0 947 884 A2 | 10/1999 |
| EP | 0 947 884 A3 | 10/1999 |
| GB | 2 149 697 A | 6/1985 |

* cited by examiner

*Primary Examiner*—Henry Hung Nguyen
(74) *Attorney, Agent, or Firm*—Pillsbury Winthrop Shaw Pittman, LLP

(57) ABSTRACT

A substrate holder has burls having a height not less than 100 μm and at least 10 vacuum ports arranged within a central region extending to a radius of two thirds the radius of the substrate. Thereby concave wafers can be reliably clamped by generating an initial vacuum in a central region which exerts a clamping force tending to flatten the wafer and allowing the initial vacuum to deepen until the wafer is fully clamped.

21 Claims, 3 Drawing Sheets

LITHOGRAPHIC APPARATUS, DEVICE MANUFACTURING METHOD AND SUBSTRATE HOLDER

The present application claims priority to European Application No. 02258833.9, filed on Dec. 20, 2002, the entirety of which is hereby incorporated into the present application by reference thereto.

BACKGROUND OF THE INVENTION

1. Field of the Invention

The present invention relates to a lithographic apparatus, a method of manufacturing a device, and a substrate holder.

2. Brief Description of Related Art

A lithographic apparatus is a machine that applies a desired pattern onto a target portion of a substrate. Lithographic apparatus can be used, for example, in the manufacture of integrated circuits (ICs). In that circumstance, a patterning device, such as a mask, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or anti-parallel to this direction. In general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference thereto.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in patents U.S. Pat. No. 5,969,441 and U.S. Pat. No. 6,262,796, which are incorporated herein by reference thereto.

To hold the substrate to the substrate table, a so-called burl plate may be used. A burl plate described in patent U.S. Pat. No. 6,232,615 (which document is incorporated herein by reference thereto) comprises a plate with a matrix arrangement of protrusions, or burls, on one face and a wall surrounding the matrix of burls. The burls all have a height of 150 µm. Holes in the burl plate lead to a vacuum system whereby the space below the wafer can be evacuated. The pressure differential between the normal atmospheric pressure above the substrate and the evacuated region below clamps the substrate firmly to the burl plate. The vacuum ports are relatively numerous, e.g. 20 or more, and are disposed in two concentric rings.

Other known designs of substrate holder have a relatively small number of vacuum ports, e.g. 3 or 4. For example, U.S. Pat. No. 5,923,408 discloses a substrate holder with three vacuum ports and protrusions that have total height of not less than 550 µm—made up of a narrow section of diameter 100 µm and height 50 µm on top of a wider section of diameter not less than 1 mm and a height not less than 500 µm. U.S. Pat. No. 5,324,012 discloses a pin chuck-type holder with a single vacuum port. The pin-type protrusions are said to have a height of from 10 µm to 500 µm but no specific examples are given. EP 1 077 393 A2 describes substrate holders that have one, four or eight vacuum ports and various arrangements of pin-like protrusions, but does not disclose the height of the pins. EP 0 803 904 A2 discloses a substrate holder that has pins of a height between 17.8–30.5 µm and four vacuum ports in a central region. GB 2 149 697 A describes a vacuum chuck with a plurality of pin-type protrusions of 50 µm in height and six vacuum ports.

The known designs of substrate holder suffer from the problem that if a concave (dished) substrate is placed on them it fails to be clamped because the wide gap between the raised edges of the substrate and the surrounding wall means that no vacuum develops underneath the substrate. Substrates can become concave due to processes carried out on them to build devices and may be discarded if they become too dished to be clamped onto the substrate table. The need to discard such substrates reduces yield and throughput.

SUMMARY

One aspect of the present invention is to provide a substrate holder that can more reliably clamp concave substrates.

According to an aspect of the invention, there is provided a lithographic apparatus comprising: an illumination system constructed to provide a beam of radiation; a support structure to support a patterning device, the patterning device constructed to impart a cross-section of the beam of radiation with a pattern to form a patterned beam of radiation; a substrate holder for holding a substrate having a radius, the substrate holder including a plurality of protrusions upstanding from a surface and having substantially coplanar extremities, a wall surrounding the plurality of protrusions, and a plurality of vacuum ports opening into a space bounded by the wall; and a projection system constructed to project the patterned beam of radiation onto a target portion of the substrate, each of the plurality of vacuum ports opening into a central region of the space bounded by the wall, the central region having a radius of not more than 70% of the radius of the substrate.

By reducing the height of the protrusions (which are also sometimes referred to as pimples or burls) and ensuring that a relatively large number of vacuum ports opens into a central region of the substrate holder, it is possible to ensure that a vacuum develops under the substrate even when the substrate is significantly concave. The pressure differential across the substrate tends to flatten the substrate enabling the initial vacuum to deepen, increasing the pressure differential and further flattening the substrate. It is therefore only necessary to develop an initial vacuum under the central region of the substrate to successfully clamp a substrate. The initial vacuum is sufficient to have a flattening effect on the substrate but need not be as deep as the vacuum developed when the substrate is clamped. The necessary depth of the initial vacuum will depend on the mechanical properties and curvature of the substrates to be clamped. Once the substrate has been clamped it is flattened against the tops of the protrusions and the clamping effect is the same as if the substrate had been flat in the first place.

It is preferred that the protrusions have a height of no less than 60 μm to ensure that the vacuum pressure under the substrate rapidly becomes uniform when the substrate is clamped. It is most preferred that the height of the protrusions is in the range of from 70 to 80 μm. With protrusions of such a height, the inventors have discovered that silicon substrates of standard dimensions with a curvature of up to 800 μm across a 300 mm wafer can be successfully clamped.

Preferably, the number of vacuum ports is in the range of from 20 to 40, all of which open into the space within the central region. In a particularly preferred embodiment of the invention, all of the vacuum ports open into an annular region having an outer radius not more than 70% of the radius of the substrate (about 100 mm for a 300 mm substrate) and an inner radius of not less than 40% of the radius of the substrate (about 60 mm for a 300 mm substrate).

According to a further aspect of the invention, there is provided a method of manufacturing a device, comprising: providing a substrate holder having a plurality of protrusions upstanding from a surface and having substantially coplanar extremities, a wall surrounding the plurality of protrusions and a plurality of vacuum ports opening into a space bounded by the wall, each of the vacuum ports being open into a central region of the space bounded by the wall, the central region having a radius of not more than 70% of the radius of a substrate configured to be held by the substrate holder; holding the substrate by evacuating the space between the substrate and the substrate holder; and projecting a patterned beam of radiation onto a target portion of the substrate.

According to yet a further aspect of the present invention, there is provided a substrate holder, the substrate holder comprising: a plurality of protrusions upstanding from a surface of the substrate holder and having substantially coplanar extremities; a wall surrounding the plurality of protrusions; and a plurality of vacuum ports opening into a space bounded by the wall, each of the vacuum ports opening into a central region of the space bounded by the wall, the central region having a radius of not more than 70% of the radius of the substrate.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5–20 nm), as well as particle beams, such as ion beams or electron beams.

The term "patterning device" or "patterning structure" used herein should be broadly interpreted as referring to as a device or structure that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

Patterning device may be transmissive or reflective. Examples of patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of patterning device, the support structure may be a frame or table, for example, which may be fixed or movable and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF ILLUSTRATED EMBODIMENTS

Figure 1:
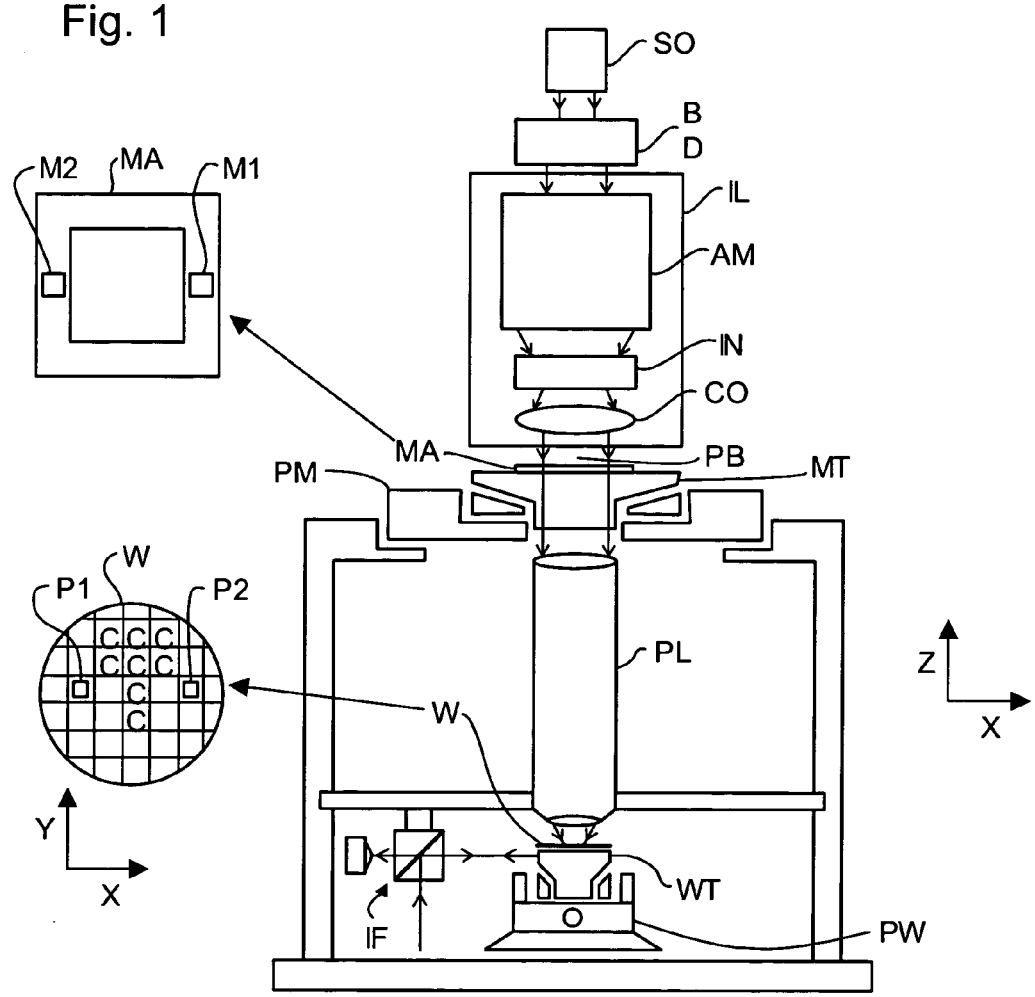
FIG. 1 depicts a lithographic apparatus according to an embodiment of the invention.

FIG. 1 schematically depicts a lithographic apparatus according to an embodiment of the invention. The apparatus comprises: an illumination system (illuminator) IL for providing a projection beam PB of radiation (e.g. UV radiation or DUV radiation), which in this particular case also comprises a radiation source SO; a first support structure (e.g. a mask table) MT for supporting patterning device (e.g. a mask) MA and connected to first positioning structure PM for accurately positioning the patterning device with respect to a projection system ("lens") PL; a substrate table (e.g. a wafer table) WT for holding a substrate (e.g. a resist-coated wafer) W and connected to second positioning structure PW for accurately positioning the substrate with respect to the projection system PL; and the projection system (e.g. a refractive projection lens) PL for imaging a pattern imparted to the projection beam PB by patterning device MA onto a target portion C (e.g. comprising one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The illuminator IL receives of radiation from the radiation source SO. The source and the lithographic apparatus may be separate entities, for example when the source is an excimer laser. In such cases, the source is not considered to form part of the lithographic apparatus and the radiation is passed from the source SO to the illuminator IL with the aid of a beam delivery system BD comprising for example suitable directing mirrors and/or a beam expander. In other cases the source may be integral part of the apparatus, for example when the source is a mercury lamp. The source SO and the illuminator IL, together with the beam delivery system BD if provided, may be referred to as a radiation system.

The illuminator IL may comprise an adjustor AM that adjusts the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation, PB, having a desired uniformity and intensity distribution in its cross-section.

The beam PB is incident on a patterning device, illustrated in the form of the mask MA, which is held on the mask table MT. Having traversed the mask MA, the beam PB passes through the lens PL, which focuses the beam onto a target portion C of the substrate W. With the aid of the second positioning structure PW and position sensor IF (e.g. an interferometric device), the substrate table WT can be moved accurately, e.g. so as to position different target portions C in the path of the beam PB. Similarly, the first positioning structure PM and another position sensor (which is not explicitly depicted in FIG. 1) can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning structure PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes.

In step mode, the mask table MT and the substrate table WT are kept essentially stationary, while an entire pattern imparted to the beam is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

In scan mode, the mask table MT and the substrate table WT are scanned synchronously while a pattern imparted to the beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

In another mode, the mask table MT is kept essentially stationary holding a programmable patterning device, and the substrate table WT is moved or scanned while a pattern imparted to the beam is projected onto a target portion C. In this mode, generally a pulsed radiation source is employed and the programmable patterning device may be updated after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
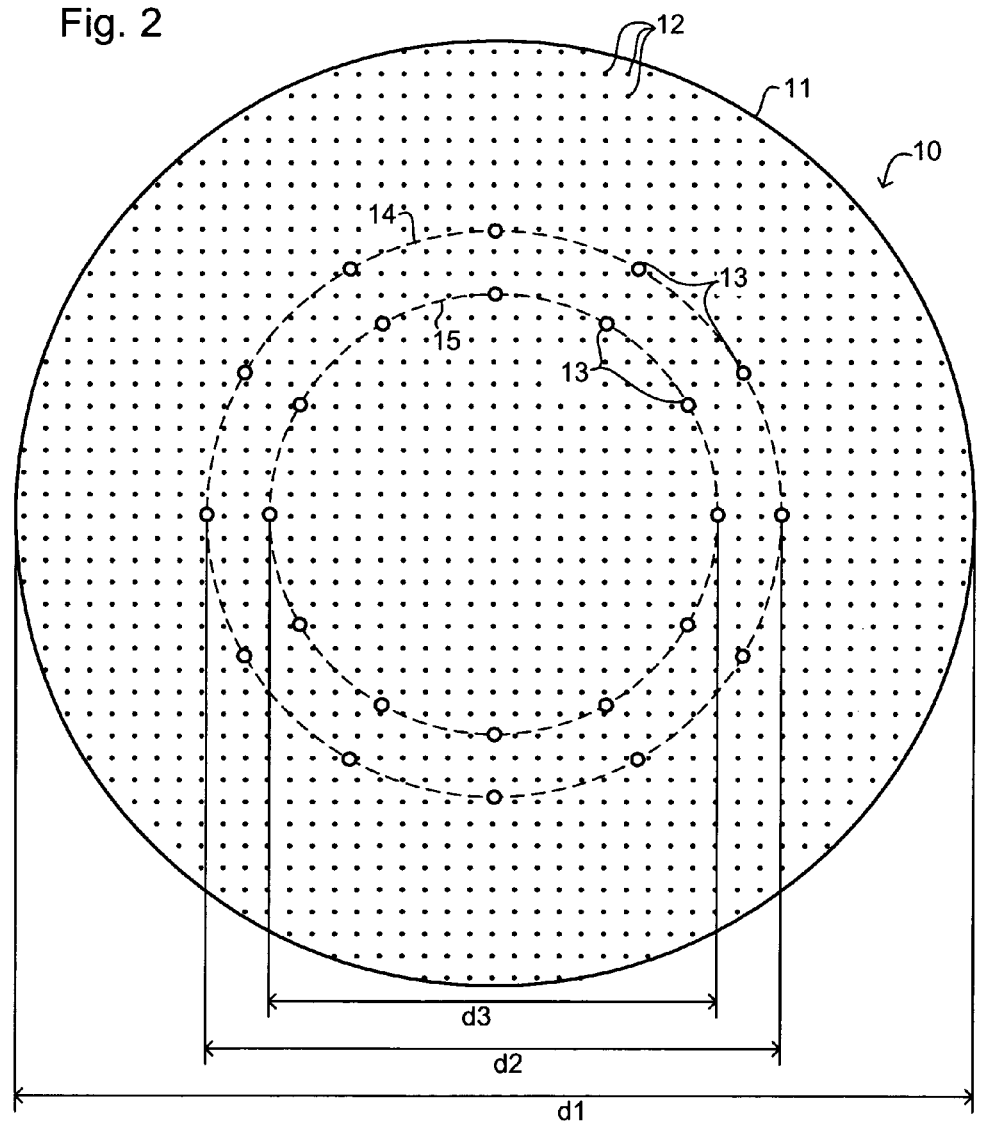
FIG. 2 is a plan view of a substrate holder in the apparatus of FIG. 1.
Figure 3:
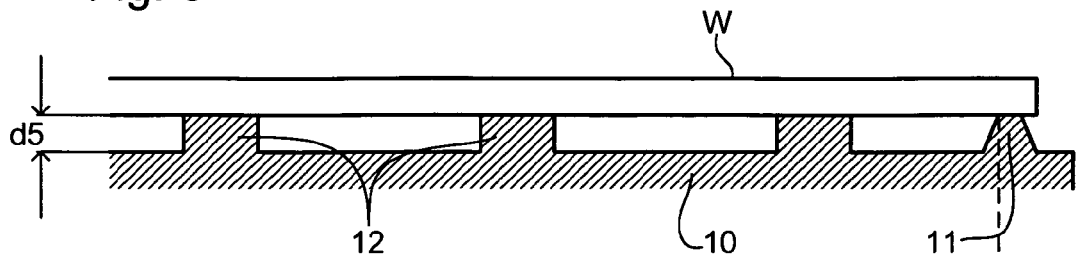
FIG. 3 is a partial sectional view of a substrate holder clamping a wafer W in accordance with an embodiment of the invention.

FIG. 2 is a plan view of a substrate holder 10 which is positioned on the substrate table WT to hold a substrate thereon during exposures. The substrate holder 10 comprises a flat circular plate, the upper face of which is provided with an array of burls or projections 12 and is bounded by a wall 11, as seen in FIG. 3. The burls 12 support the substrate W and have a total area of usually less than about 4% of the area of the substrate. Whilst for illustrative purposes the burls 12 are shown as arrayed in a regular rectagonal matrix, other arrangements are possible, e.g. concentric rings.

The burl plate is also provided with through-holes 13, in this example there are 24 through-holes, arranged regularly around two concentric rings 14, 15. Through-holes 13 line up with vacuum ports on the substrate table WT and form vacuum ports for evacuation of the space below the substrate W and bounded by the wall 11.

The substrate W is removed from the substrate holder 10 by turning off the vacuum and lifting it from below by pins which extend through further holes (not shown) in the substrate holder 10. These further holes may be surrounded by walls that rise to meet the substrate so that there is no leakage of air into the space under the substrate via these holes.

Figure 4:
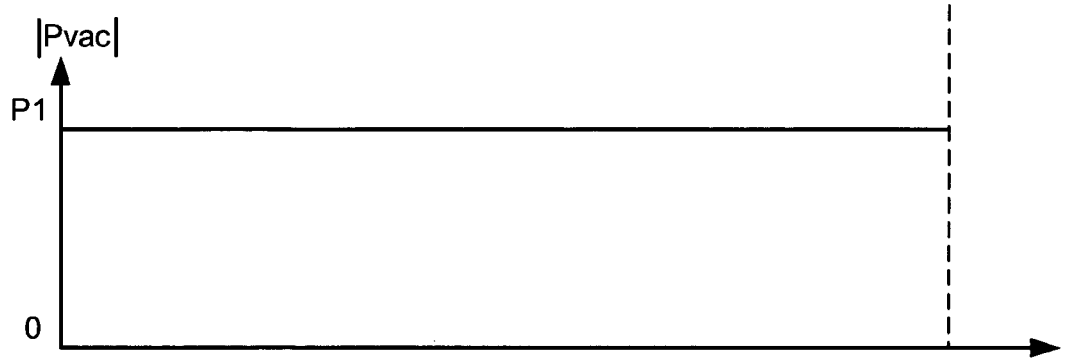
FIG. 4 is a graph showing the vacuum pressure underneath the substrate in FIG. 3.

FIG. 4 is a graph of vacuum pressure |Pvac|, that is the magnitude of the difference between the pressure in a space below the wafer W and normal atmospheric pressure above. When a wafer W is clamped correctly on the substrate table WT, the pressure underneath the wafer W in the area within the wall 11 is at a uniform high vacuum level P1.

Figure 5:
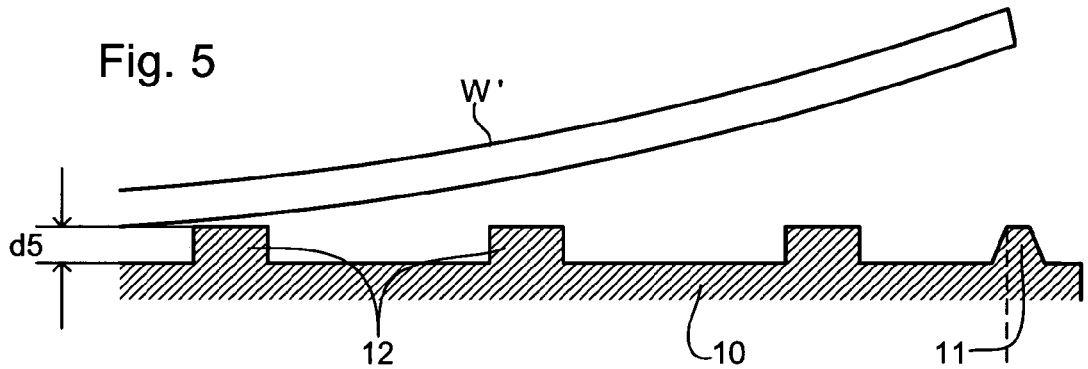
FIG. 5 is a partial sectional view of a substrate holder in an initial stage of clamping a concave wafer in accordance with an embodiment of the invention.
Figure 6:
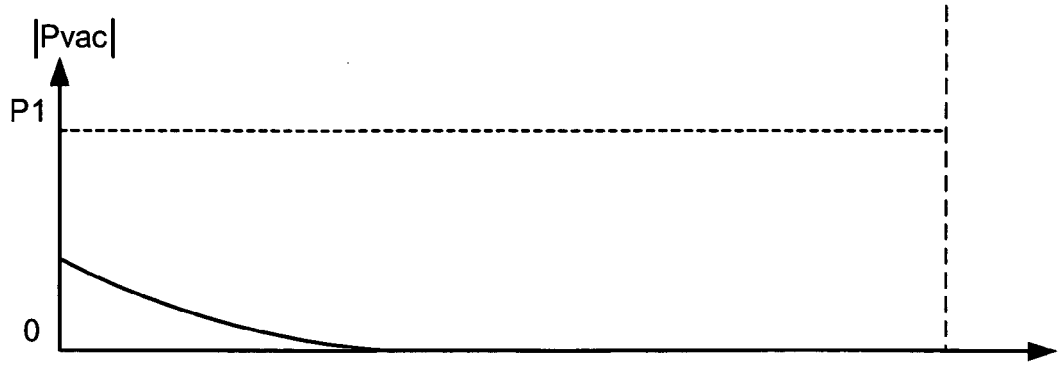
FIG. 6 is a graph showing the vacuum pressure under the wafer in FIG. 5.

FIGS. 5 and 6 illustrate what happens when a concave wafer W' is presented to the substrate holder 10. At its outer edge, the curvature of the wafer W' means that there is a large gap between the wafer W' and the substrate holder 10 so that the pressure in this area is the same as above the wafer and there is no clamping effect. However, because according to an embodiment of the invention the heights of the projections 12 are reduced and the vacuum ports are arranged in a central region of the substrate holder 10, a vacuum does develop in the central region below the wafer W', as indicated by the solid curved line in FIG. 6. There is therefore a pressure differential across the wafer W' causing a clamping force, albeit initially small, that clamps the wafer W' to the substrate holder 10 and also tends to flatten the substrate W'. The flattening of the substrate W' reduces the gap between it and the substrate holder 10 allowing the vacuum in the central region to deepen. This in turn increases the flattening force on the substrate W' and consequently the substrate W' is rapidly flattened and fully clamped to the substrate holder 10. The vacuum level underneath the substrate W' then reaches the normal level, as indicated by the dashed line in FIG. 6.

The inventors have determined that certain conditions on the height d5 of the projections 12 and the number and positioning of the vacuum ports 13 are satisfied in order to enable concave substrates to be clamped. The height of the projections 12 should be sufficiently small so that there is some resistance to airflow inwards under a curved substrate W' placed on the substrate holder 10 to allow an initial vacuum to develop underneath the central portion. At the same time however, the projections 12 should not be so short that the area of initial vacuum is confined too close to the vacuum ports 13 and a uniform vacuum level underneath the wafer cannot be obtained. The inventors have determined that to ensure clamping of curved wafers W' the projections 12 should have a height no more than 100 µm. The height being measured from the surface representing most of the area of the substrate holder. Thereby the space below a substrate resting on the protrusions has a maximum depth of 100 µm (excepting where the vacuum ports open). It may also be advantageous that the height is no less than 60 µm to ensure the vacuum pressure under the substrate quickly becomes uniform when the wafer is fully clamped. Clamping is particularly effective if the burl height is in the range of from 70 to 80 µm. A substrate holder 10 with projections having a height of 75 µm was found to reliably clamp substrates where the maximum curvature was up to 800 µm for a 300 mm wafer.

For the number and arrangement of vacuum ports 13, it is necessary that they be sufficient in number and distributed sufficiently close to the center of the wafer to generate an initial vacuum. However, the vacuum ports should not be too far from the edge of the burl plate to ensure that the clamping process of concave wafers W' is initiated. The inventors have determined that there should be at least 10 vacuum ports within a central region. The central region is preferably bounded by a circle of radius less than or equal to 70% of the radius d1 of the substrate, e.g. 100 mm for a 300 mm (diameter) substrate. There should be no vacuum ports opening outside this central region. It is particularly preferred that the vacuum ports open into an annular region having an outer radius no more than 70% of the radius of the substrate and an inner radius no less than 40% of the radius of the substrate. In the described embodiment the vacuum ports are provided on rings 14, 15 having radii d2, d3 of 90 mm and 70 mm respectively.

While specific embodiments of the invention have been described above, it will be appreciated that the aspects of the invention may be practiced otherwise than as described. The description is not intended to limit the invention.

What is claimed is:

1. A lithographic apparatus, comprising:
   an illumination system constructed to provide a beam of radiation;
   a support structure to support a patterning device, said patterning device constructed to impart a cross-section of said beam of radiation with a pattern to form a patterned beam of radiation;
   a substrate holder for holding a substrate having a radius, said substrate holder including a plurality of protrusions upstanding from a surface and having substantially coplanar extremities, a wall surrounding said plurality of protrusions, and a plurality of vacuum ports opening into a space bounded by said wall; and a projection system constructed to project said patterned beam of radiation onto a target portion of said substrate, each of said plurality of vacuum parts opening into a central region of said space bounded by said wall, said central region having an outer radius of not more than 70% of said radius of said substrate.

2. An apparatus according to claim 1, wherein each of the plurality of protrusions has a height of not more than 100 µm.

3. An apparatus according to claim 2, wherein said height of said protrusions is not less than 60 µm.

4. An apparatus according to claim 3, wherein said height of said protrusions is between 70 to 80 µm.

5. An apparatus according to claim 1, wherein said plurality of vacuum ports includes 20 to 40 vacuum ports.

6. An apparatus according to claim 1, wherein said central region is an annular region having the outer radius of no more than 70% of said radius of said substrate and an inner radius of no less than 40% of said radius of said substrate.

7. An apparatus according to claim 1, wherein said plurality of vacuum ports comprises at least ten vacuum ports.

8. A method of manufacturing a device, comprising:
providing a substrate holder having a plurality of protrusions upstanding from a surface and having substantially coplanar extremities, a wall surrounding the plurality of protrusions and a plurality of vacuum ports opening into a space bounded by the wall, each of the vacuum ports being open into a central region of the space bounded by the wall, the central region having an outer radius of not more than 70% of a radius of a substrate configured to be held by the substrate holder;
holding the substrate by evacuating the space between the substrate and the substrate holder; and
projecting a patterned beam of radiation onto a target portion of the substrate.

9. A method according to claim 8, wherein each of the plurality of protrusions has a height of not more than 100 µm.

10. A method according to claim 9, wherein the height of said protrusions is not less than 60 µm.

11. A method according to claim 10, wherein the height of said protrusions is between 70 and 80 µm.

12. A method according to claim 8, wherein said plurality of vacuum ports comprises at least ten vacuum ports.

13. A method according to claim 8, wherein said plurality of vacuum ports includes 20 to 40 vacuum ports.

14. A method according to claim 8, wherein the central region is an annular region having the outer radius of no more than 70% of said radius of said substrate and an inner radius of no less than 40% of the radius of the substrate.

15. A substrate holder comprising:
a plurality of protrusions upstanding from a surface of said substrate holder and having substantially coplanar extremities;
a wall surrounding said plurality of protrusions; and
a plurality of vacuum ports opening into a space bounded by said wall,
each of said vacuum ports opening into a central region of said space bounded by said wall, said central region having an outer radius of not more than 70% of a radius of a substrate configured to be held by the substrate holder.

16. A substrate holder according to claim 15, wherein each of the plurality of protrusions has a height of not more than 100 µm.

17. A substrate holder according to claim 16, wherein the height of said protrusions is not less than 60 µm.

18. A substrate holder according to claim 17, wherein the height of said protrusions is between 70 and 80 µm.

19. A substrate holder according to claim 15, wherein said plurality of vacuum ports comprises at least ten vacuum ports.

20. A substrate holder according to claim 15, wherein said plurality of vacuum ports includes 20 to 40 vacuum ports.

21. A substrate holder according to claim 15, wherein the central region is an annular region having the outer radius of no more than 70% of said radius of said substrate and an inner radius of no less than 40% of the radius of the substrate.

* * * * *